US010470340B2

(12) United States Patent
Skoglund et al.

(10) Patent No.: US 10,470,340 B2
(45) Date of Patent: Nov. 5, 2019

(54) FLUE DEVICE FOR COMPUTER RACKS

(71) Applicant: Level 3 Communications, LLC, Broomfield, CO (US)

(72) Inventors: Joel S. Skoglund, Brighton, CO (US); Joseph Nguyen, Denver, CO (US)

(73) Assignee: Level 3 Communications, LLC, Broomfield, CO (US)

( * ) Notice: Subject to any disclaimer, the term of this patent is extended or adjusted under 35 U.S.C. 154(b) by 0 days.

(21) Appl. No.: 16/176,755

(22) Filed: Oct. 31, 2018

(65) Prior Publication Data

US 2019/0132996 A1     May 2, 2019

Related U.S. Application Data

(60) Provisional application No. 62/579,697, filed on Oct. 31, 2017.

(51) Int. Cl.
H05K 7/20 (2006.01)
H05K 7/14 (2006.01)
H05K 5/02 (2006.01)

(52) U.S. Cl.
CPC ....... *H05K 7/20718* (2013.01); *H05K 5/0213* (2013.01); *H05K 7/1401* (2013.01); *H05K 7/20145* (2013.01); *H05K 7/20172* (2013.01); *H05K 7/20736* (2013.01)

(58) Field of Classification Search
CPC .......... H05K 7/20145; H05K 7/20736–20745
See application file for complete search history.

(56) References Cited

U.S. PATENT DOCUMENTS

| | | | | |
|---|---|---|---|---|
| 3,192,306 | A * | 6/1965 | Skonnord | H05K 7/20572 174/16.1 |
| 6,722,151 | B2 * | 4/2004 | Spinazzola | G06F 1/20 62/259.2 |
| 7,286,345 | B2 * | 10/2007 | Casebolt | G06F 1/20 361/679.48 |
| 8,154,870 | B1 * | 4/2012 | Czamara | H05K 7/20736 361/694 |
| 8,248,796 | B2 * | 8/2012 | Sun | H05K 7/20727 361/694 |
| 8,345,419 | B2 * | 1/2013 | Sun | H05K 7/20736 361/679.46 |
| 8,544,289 | B2 * | 10/2013 | Johnson | H05K 7/20836 361/695 |
| 9,596,790 | B2 * | 3/2017 | Ambriz | H05K 7/20181 |
| 9,913,410 | B2 * | 3/2018 | Ambriz | H05K 7/20181 |
| 2005/0237716 | A1 * | 10/2005 | Chu | H05K 7/20736 361/696 |
| 2012/0243175 | A1 * | 9/2012 | Okada | H05K 7/20745 361/690 |
| 2018/0228057 | A1 * | 8/2018 | Beall | H05K 7/20736 |

FOREIGN PATENT DOCUMENTS

WO    WO-2008014578 A1 *    2/2008    ......... H05K 7/20745

* cited by examiner

*Primary Examiner* — Robert J Hoffberg (57) ABSTRACT

A flue device for use with a computer rack includes an elongate body having an open end and defining a ventilation channel. The flue device further includes a coupling feature adapted to couple the elongate body to the computer rack. When coupled to the computer rack, the elongate body extends in a substantially vertical direction with the open end extending upward and is positioned to cover each of the respective vents to receive air from the vents and direct the received air toward the open end.

20 Claims, 12 Drawing Sheets

FLUE DEVICE FOR COMPUTER RACKS

CROSS-REFERENCE TO RELATED APPLICATION

This application is related to and claims priority under 35 U.S.C. § 119(e) from U.S. Patent Application No. 62/579,697 filed Oct. 31, 2017, entitled "FLUE DEVICE FOR A COMPUTER RACKS," the entire contents of which is incorporated herein by reference for all purposes.

TECHNICAL FIELD

Aspects of the present disclosure involve a flue device for use in managing heat generated by computing devices of a computer rack or similar computing system.

INTRODUCTION

Data centers and similar facilities generally include interconnected computing and networking devices that are often arranged in computer racks or cabinets. Modern data centers may cover tens or even hundreds of thousands of square feet and include hundreds or even thousands of individual cabinets. Each such cabinet may include multiple computing devices that generate heat and that can suffer from inefficient performance and even damage if allowed to exceed certain operating temperatures. As a result, careful management of a data center's ambient environment and, in particular, ensuring adequate circulation of hot and cool air within such an environment is a key aspect to ensuring optimal performance and maximizing uptime of a data center.

With these thoughts in mind among others, aspects of the cable spool system disclosed herein were conceived.

SUMMARY

In one implementation of the present disclosure, flue device for computer racks. The flue device includes an elongate body having an open end and defining a ventilation channel. The flue device further includes coupling features disposed along the elongate body. Each coupling feature is adapted to detachably couple the elongate body to at least one of the computer rack or a computing device retained within the computer rack. When coupled to the computer rack, the elongate body extends in a substantially vertical direction with the open end extending upward and is positioned to extend over one or more vents of computing devices retained within the computer rack, to receive air from the one or more vents, and to direct the received air toward the open end.

In another implementation of the present disclosure a computer rack. The computer rack includes a frame, a computing device mounted within the frame, the computing device including a vent, and a flue device supported, at least in part, by at least one of the frame or the computing device. The flue device includes an elongate body having an open end and defining a ventilation channel. The flue device further includes coupling features disposed along the elongate body. Each coupling feature is adapted to couple the elongate body to at least one of the computer rack or a computing device retained within the computer rack. When coupled to the computer rack, the elongate body extends in a substantially vertical direction with the open end extending upward and is positioned to extend over one or more vents of computing devices retained within the computer rack, to receive air from the one or more vents, and to direct the received air toward the open end.

BRIEF DESCRIPTION OF THE DRAWINGS

Example embodiments are illustrated in referenced figures of the drawings. It is intended that the embodiments and figures disclosed herein are to be considered illustrative rather than limiting.

DETAILED DESCRIPTION

Aspects of the present disclosure involve a flue device for use with a computer rack or cabinet. The flue device is adapted to be coupled to the computer rack or cabinet, to receive hot air from exhaust ports or similar ventilation structures of computing equipment within the rack, and to direct the hot air above the computer rack. The heated air may subsequently be directed into a heating ventilation and air conditioning (HVAC) or similar system for managing air circulation and air temperature.

Figure 1:
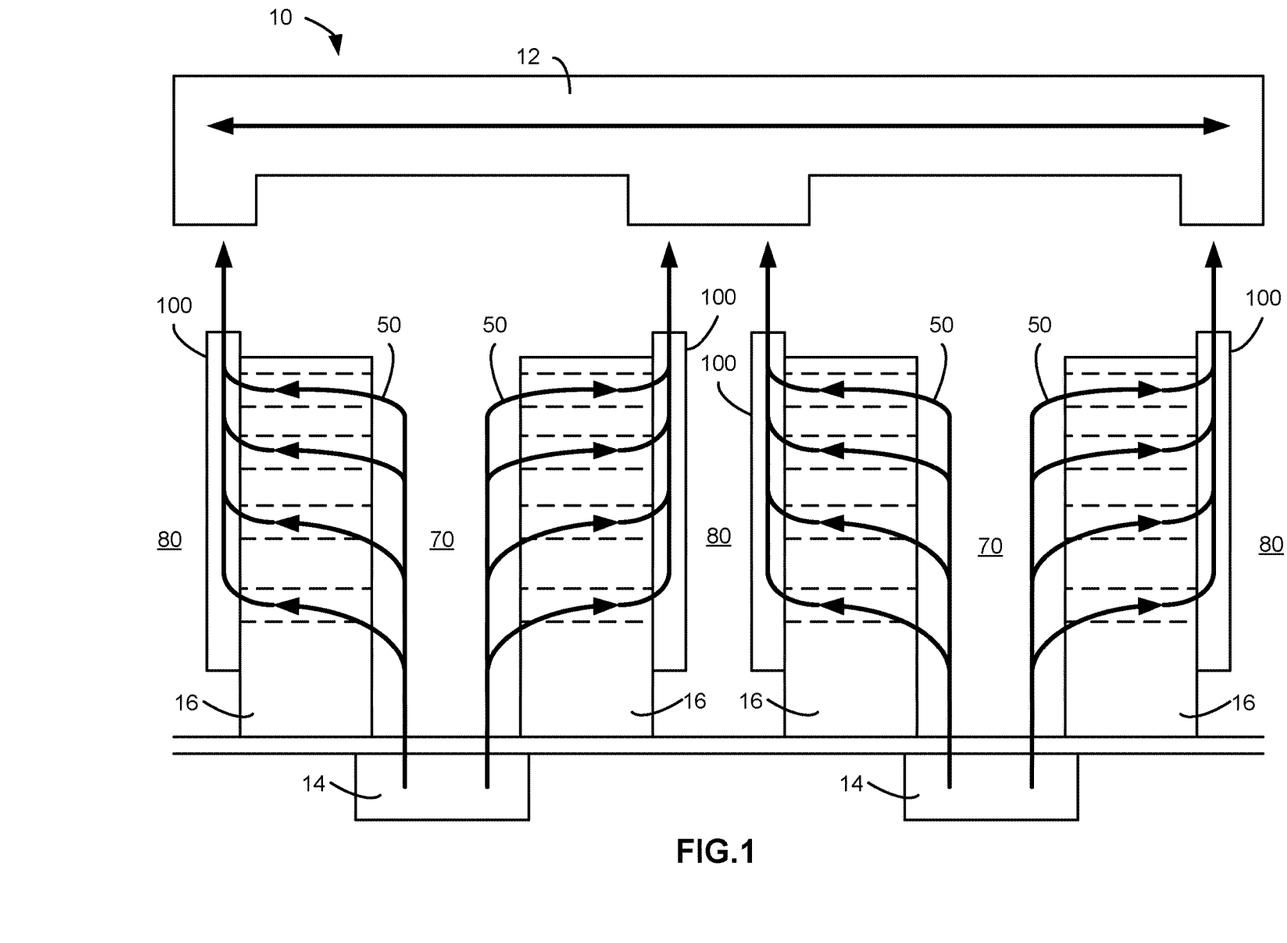
FIG. 1 is a schematic illustration of a server environment including computer racks having flue devices in accordance with the present disclosure.

FIG. 1 is a schematic illustration of a server or data center environment 10 including a plurality of computer racks 16. Each computer rack 16 may include one or more rack-mounted computing devices including, without limitation, servers, switches, data storage devices, and computing appliances which may in turn be connected to other computing devices, including other rack-mounted computing devices within the environment 10. The computer racks 16 may further include auxiliary equipment such as, without limitation, cooling units, power systems, cable management systems, and shelving or other structural components.

During operation, the components of the rack-mounted computing devices contained within the computer racks 16 generate heat. Absent sufficient ventilation, such heat can cause components of the rack-mounted computing devices to function inefficiently or even fail. Accordingly, rack-mounted computing devices often include a fan or similar ventilation device to remove heated air from within the rack-mounted computing device by drawing in cool air from a forward port and pushing heated air out a rear ventilation port. However, in an environment including multiple computer racks, each of which may include multiple heat-producing computing devices, the collective exhaust heat in the surrounding environment can rapidly increase temperatures of the surrounding environment such that the cooling systems of the rack-mounted computing devices are essentially ineffective.

To overcome this issue and as illustrated in FIG. 1, the computer racks 16 may be arranged in parallel or substantially parallel rows with the ventilation and cooling systems of each individual rack-mounted computing device within a given row arranged to draw air in from a first side of the computer racks 16 and eject heated air from a second, opposite side. Adjacent rows are often arranged such that the rack-mounted computing devices of one row of computer racks 16 face those in the adjacent row. As a result, "cold" aisles 70 are created between the front faces of the computer racks 16 and "hot" aisles 80 are created between the rear faces of the computer racks 16. In such an arrangement, a heating, ventilation, and air-conditioning (HVAC) system may be used to provide cooled air into the cold aisles 70 and to receive heated air from the hot aisles 80. For example, as illustrated in FIG. 1, cooled air may be provided through cold air ducts 14 embedded into the floor into the cold aisles 70 while heated air may be drawn out through an overhead ventilation system 12 from the hot aisles 80.

Although such an arrangement may improve air flow within the environment 10, hot air may nevertheless accumulate and pool within the hot aisles 80 and eventually mix with the cooled air provided into the cold aisles 70. To facilitate directing heated air from the computer racks 16 to a volume above the computer racks 16 such that the heated air may be removed by an overhead ventilation system 12, the computer racks 16 each include a flue device 100 coupled to their respective rear faces. In general, the flue devices 100 are configured to accumulate exhaust air from the rack-mounted computing devices of their respective computer racks 16 and to direct the heated air upward and away from the supply of cooled air received from the cold air ducts 14. By doing so, mixing of the heated exhaust air and fresh cooled air is minimized, thereby improving the overall cooling efficiency of the individual computer racks 16 and reducing heat buildup within the overall environment 10.

Figure 2:
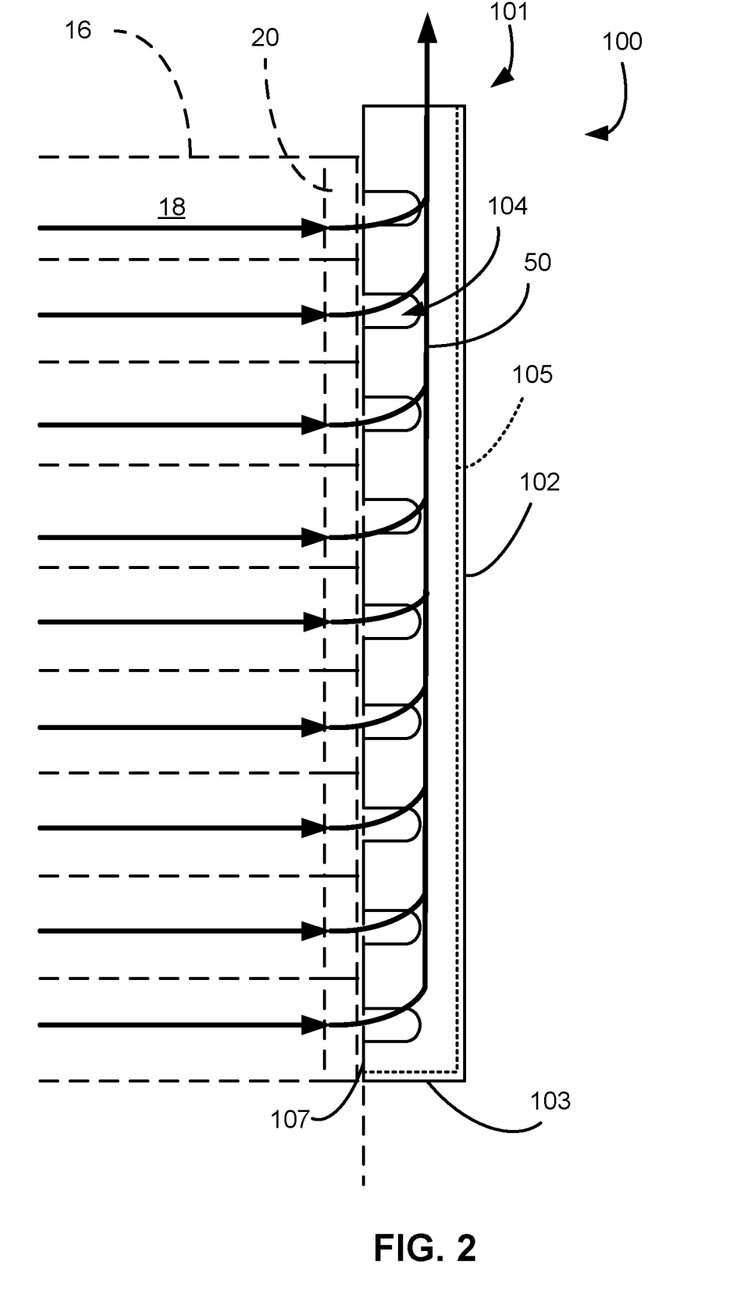
FIG. 2 is a detail view of a computer rack of FIG. 1 including a flue device.

FIG. 2 is a side detail view of a flue device 100 coupled to a computer rack 16 (shown in dashed lines). The flue device 100 is illustrated in FIG. 2 in a simplified configuration including an elongate body 102 having an upper open end 101 and a closed bottom end 103. The elongate body 102 generally defines a ventilation channel 105 with an open side 107 that faces the computer rack 16 when the flue device 100 is coupled to the computer rack 16. When the flue device 100 is coupled to the computer rack 16, the ventilation channel 105 is positioned to receive heated air from cooling and ventilation systems of the rack-mounted equipment of the computer rack 16. For example, the computer rack 16 includes a rack-mounted computing device 18 including a fan 20 or similar ventilation system that draws air through the rack-mounted computing device 18 and into the ventilation channel 105. The heated air 50 within the ventilation channel 105 is then permitted to rise upward and out of the flue device 100 through the upper open end 101.

Figure 3A:
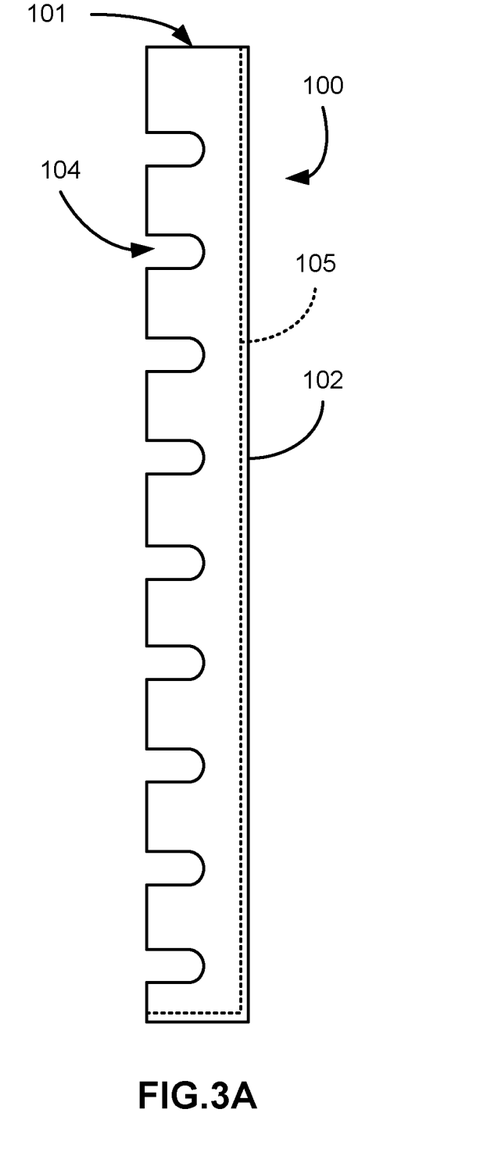
FIGS. 3A and 3B are a side elevation view and a cross-sectional side view, respectively, of the flue device of FIG. 2.
Figure 3B:
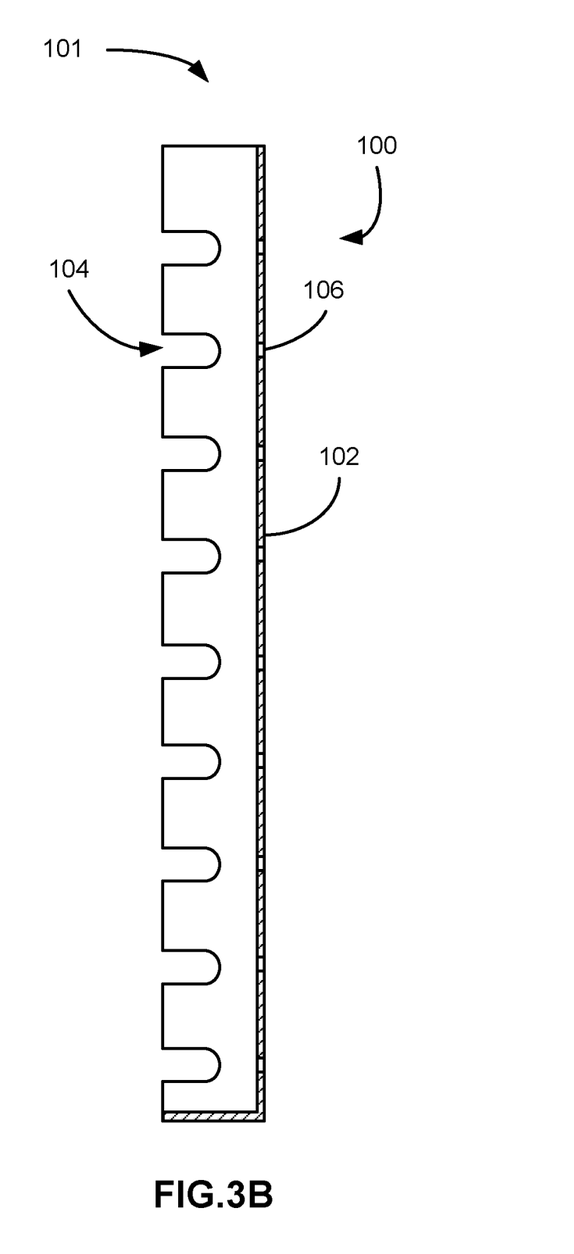
Figure 4A:
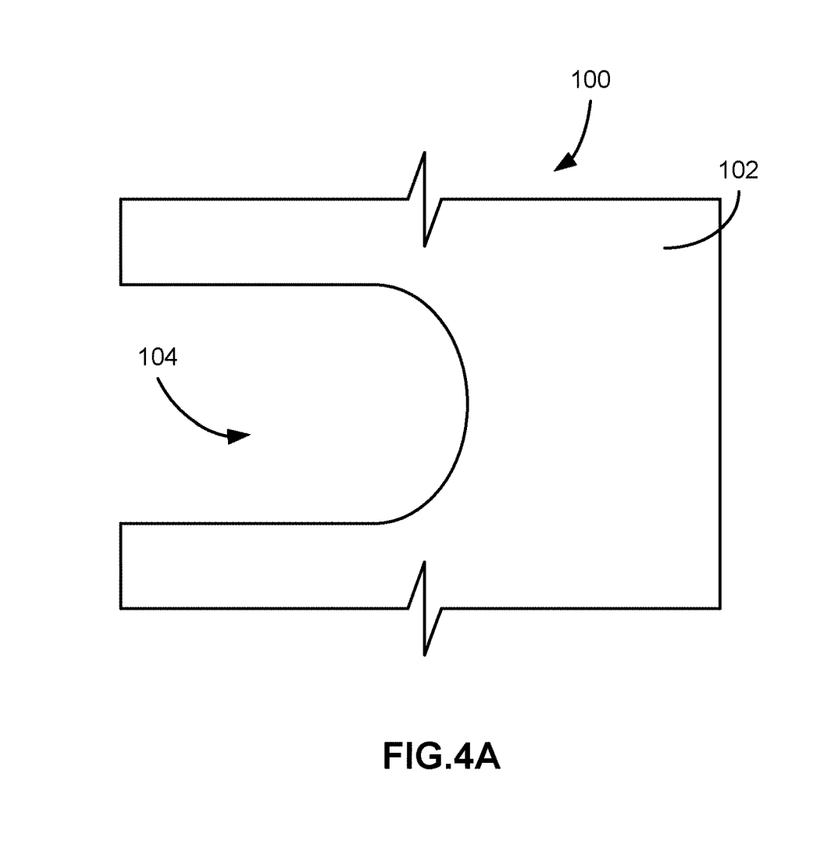
FIGS. 4A and 4B are detail views of cable cutouts of the flue device of FIG. 2.
Figure 4B:
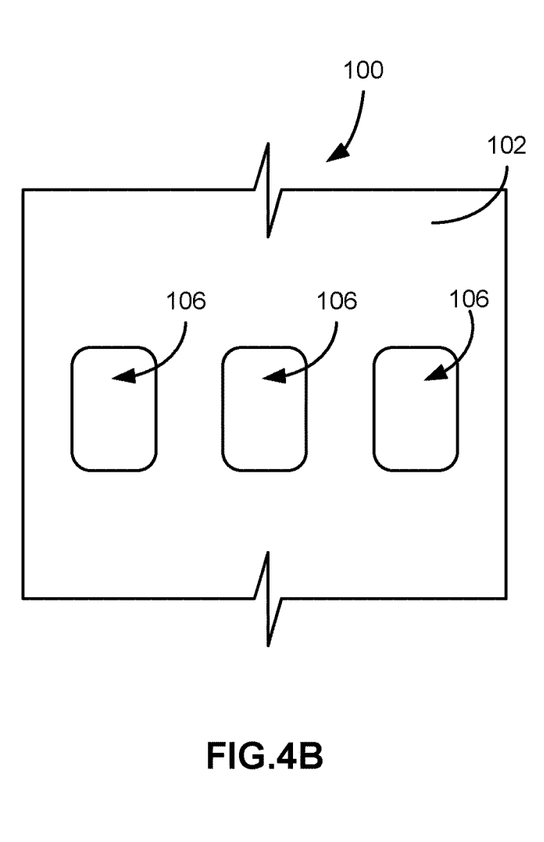

FIGS. 3A and 3B are side elevation and side cross-sectional views of the flue device 100 detached from the computer rack 16. As previously noted, the flue device 100 includes an elongate body 102. As shown in FIGS. 3A and 3B, the elongate body 102 may define multiple cable cutouts distributed along its length. For example, the elongate body 102 includes both side cutouts 104 and rear cutouts 106 such that cables may be routed through or into the elongated body 102. A side cable cutout 104 and a set of rear cable cutouts 106 are illustrated in FIGS. 4A and 4B, which are detailed side and rear views of the flue device 100, respectively.

The shapes of the side cutouts 104 and the rear cutouts 106 shown in FIGS. 3A-4B are merely illustrative and are not intended to limit the scope of the present disclosure. More generally, the side cutouts 104 and the rear cutouts 106 may or may not be included in implementations of the current disclosure and, when included, may be distributed and may have shapes other than those illustrated. Rather, the cutouts 104, 106 are more generally intended to enable cables to be run into or through the flue device 100. For example, the flue device 100 generally includes each of a side cable cutout 104 and a set of rear cable cutouts 106 disposed at regular intervals along the length of the elongate body 102. In certain implementations, such intervals may be based on standard rack units (RU), which are approximately 1.75 inches, such that each side cable cutout 104 and corresponding set of rear cable cutouts 106 is disposed at regular 1RU, 2RU, 4RU, or any other suitable RU intervals. In other implementations, the cable cutouts 104, 106 may be unevenly distributed along the length of the elongate body 102 or otherwise omitted along some or all of the length of the elongate body 102. For example, to reduce the likelihood of air escaping from the ventilation channel 105, the elongate body 102 may omit cable cutouts 104, 106 in locations corresponding to portions of the computer rack 16 in which no fan 20 or similar ventilation system is disposed.

Figure 5:
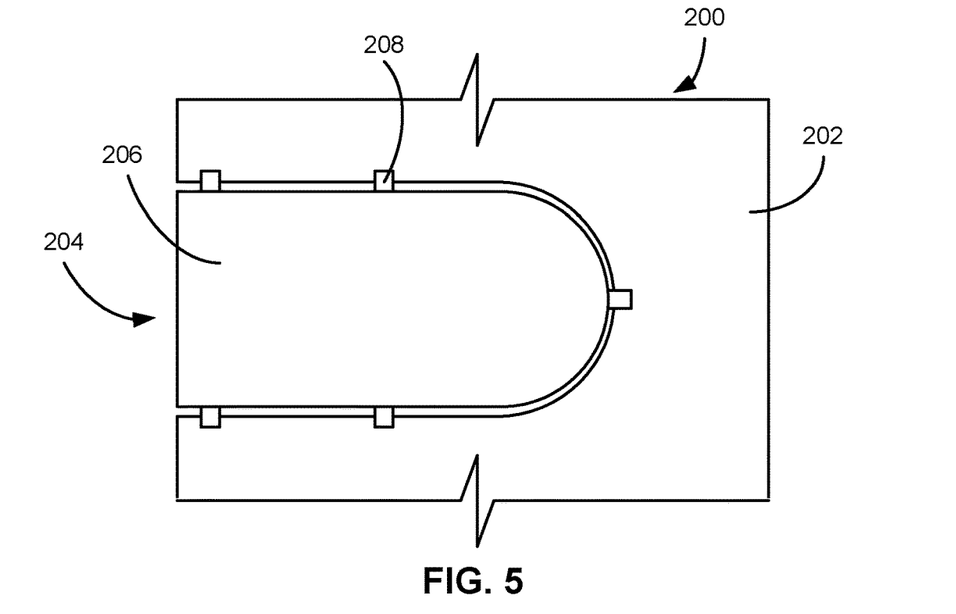
FIG. 5 is a side detail view of a cable cutout for a second implementation of a flue device, the flue device including a knockout.

FIG. 5 is a side detail view of another flue device 200. Similar to the flue device 100, the flue device 200 includes an elongate body 202 defining at least one cable cutout 204. In contrast to the flue device 100, however, the flue device 200 includes a knockout 206 that substantially covers the cable cutout 204 and that may be removed in order to open the cable cutout 204. For example, the knockout 206 includes tabs, such as a tab 208, which couple the knockout 206 to the elongate body 202. To remove the knockout 206, force may be applied to the knockout 206 to break the tabs 208, allowing the knockout 206 to be removed. Such knockouts 206 may be disposed along the length of the elongate body 202 such that, when installing the flue device 200 onto a computer rack, the option is provided to remove only the knockouts 206 corresponding to locations in which cables will actually be run. As a result, the opportunity for air to leak from within the elongate body is reduced.

In other implementations, caps or similar detachable covers may be used in addition to or instead of the knockouts 206. In such implementations, the covers may be selectively coupled and decoupled from the elongate body 202 such that the flue device 200 may be reconfigured. While illustrated in FIG. 5 as being applied to a side cable cutout 204, similar knockouts, caps, or other covers may also be used on any other cable cutouts or openings of flue devices in accordance with this disclosure.

Figure 6:
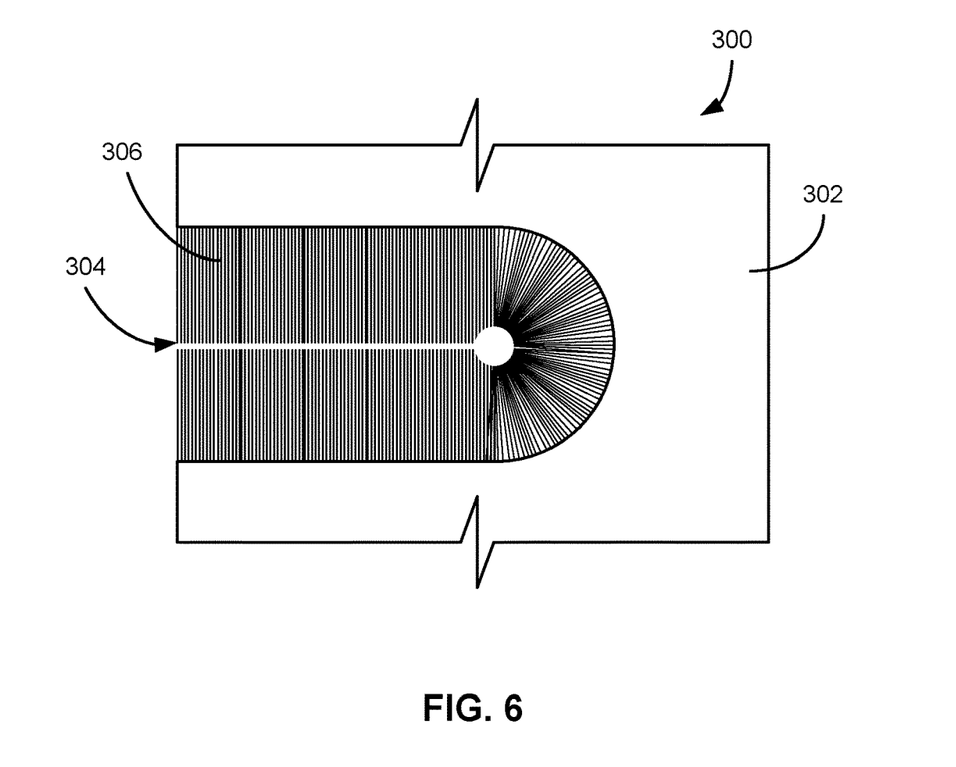
FIG. 6 is a side detail view of a cable cutout for a third implementation of a flue device, the flue device including a fiber-based cable support system.

FIG. 6 is another flue device 300 including an elongate body 302 defining a cable cutout 304. The flue device 300 includes a set of fibers 306 extending from the elongate body 302 into the cable cutout 304. Such fibers 306 support and retain cables or other objects extending into the elongate body 302 while also reducing leakage from the elongate body 302. Similar to the previously discussed knockouts and caps, similar fibers may be included in any opening or cutout of the flue device 300.

Figure 7:
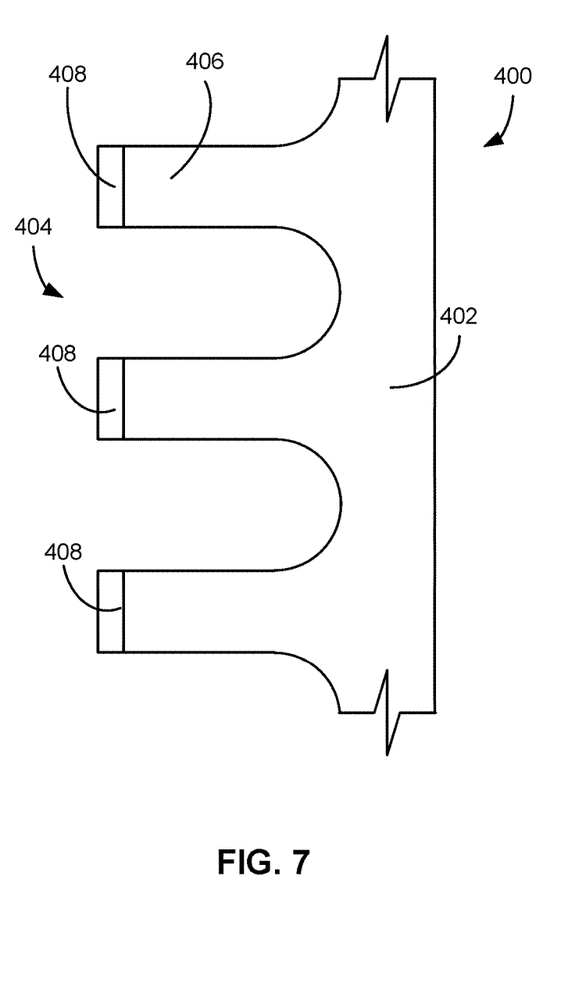
FIG. 7 is a side detail view of a fourth implementation of a flue device, the flue device including magnetic coupling elements.

Flue devices in accordance with this disclosure may be coupled to a computer rack in various ways. For example, FIG. 7 illustrates another flue device 400 including an elongate body 402 that further includes extensions 406 and that defines cable cutouts, such as cable cutout 404. Each of the extensions 406 terminates in a magnet 408 that may be used to couple the flue device 400 to a corresponding magnetic structure of a computer rack. Although illustrated as being disposed on the tip of each extension, the placement of magnets on the flue device 400 are not limited to such arrangements. Rather, magnets may be placed anywhere along the surface of the flue device 400 that contacts the computer rack to which the flue device 400 is coupled. In certain implementations, the magnets may be removable or slidable along rails, grooves, or similar features of the elongate body 402 such that the magnets may be repositioned relative to the elongate body 402 to account for variations in computer racks.

Figure 8:
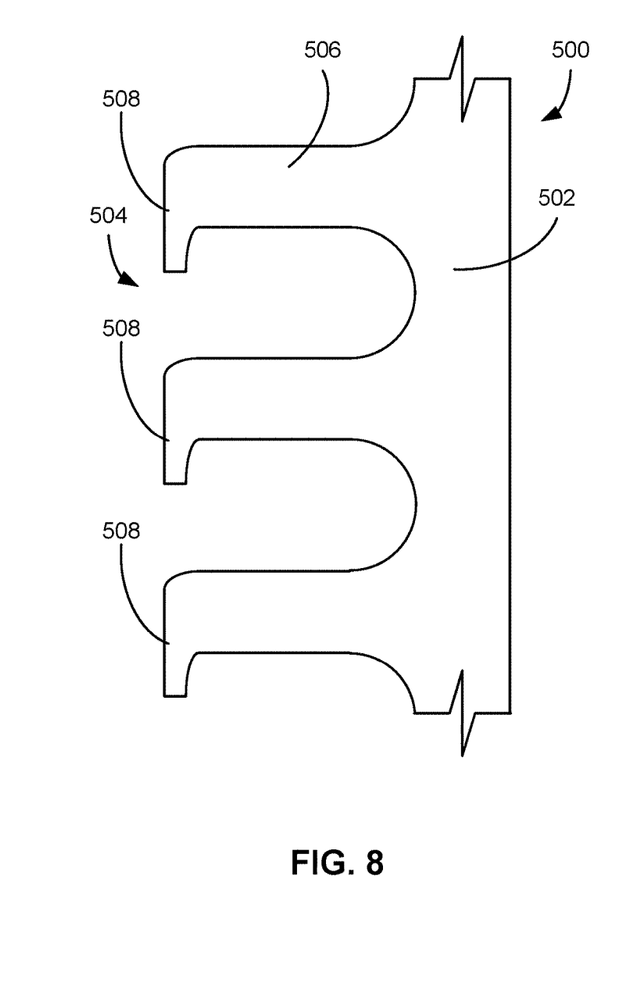
FIG. 8 is a side detail view of a fifth implementation of a flue device, the flue device including hooked coupling elements.

FIG. 8 is an alternative flue device 500 including an elongate body 502 that further includes extensions 506 and that defines cable cutouts, such as cable cutout 504. Each of the extensions 506 terminates in a hook structure 508 that may be used to couple the flue device 500 to a corresponding structure of a computer rack. For example, the hook structure 508 may be shaped to be inserted into a slot or to otherwise engage a corresponding structure of the computer rack itself or a device or accessory of the computer rack.

Figure 9A:
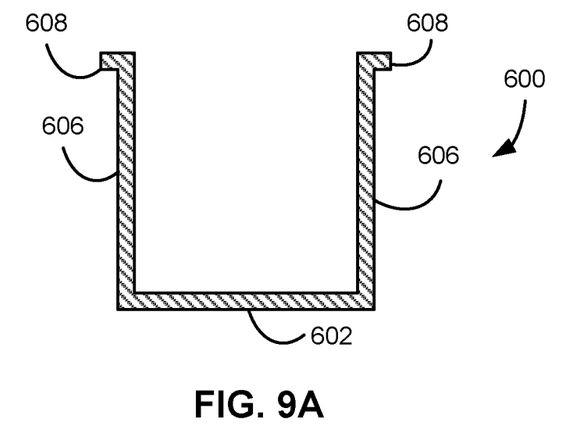
FIGS. 9A-9C are cross-sectional top views of a sixth flue device illustrating coupling of the sixth flue device to a wall structure.
Figure 9B:
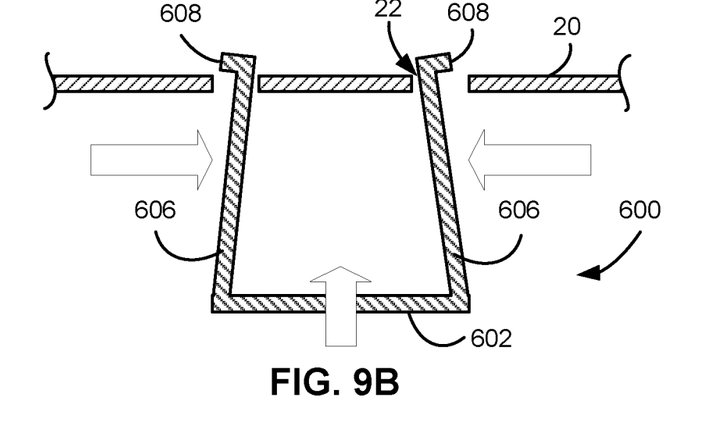
Figure 9C:
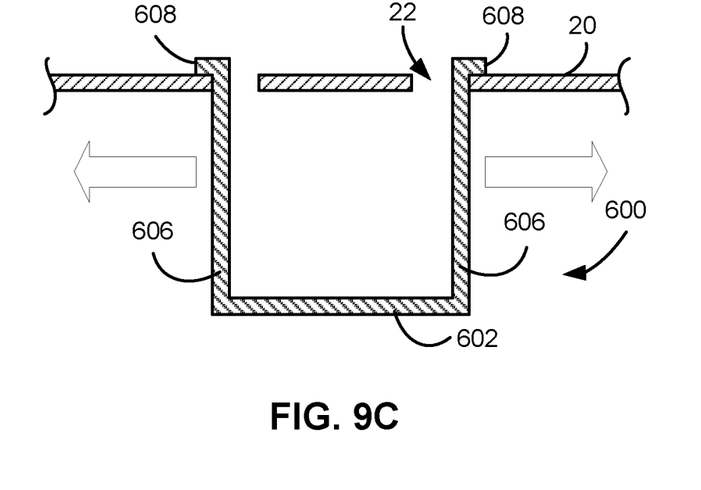

FIGS. 9A-9C are cross-sectional views of another flue device 600 in accordance with the present disclosure and illustrate coupling of the flue device 600 to a wall 20 of a computer rack or device contained within a computer rack. The flue device 600 includes an elongate body 602 and a pair of opposed extensions 606 that terminate in tabs 608. As shown in FIG. 9B, the extensions 606 are adapted to flex inwardly when an inward force is applied such that the tabs 608 may be inserted into gaps 22 defined within the wall 20. After insertion of the tabs 608 into the wall 20, the inward force may be removed from the extensions 606 such that the elongate body 602 returns to its original shape and the tabs 608 prevent removal of the flue device 600 from the wall 20.

The magnet, hook and clip arrangements of FIGS. 7-9C are merely examples of ways that flue devices in accordance with this disclosure may be coupled to computer racks or similar structures. In other implementations, other approaches may be used. For example, in certain implementations hook and loop fasteners, tapes, or adhesives may be used to attach the flue device to a computer rack. If tape or an adhesive is used, the tape or adhesive is preferably sufficiently heat resistant such that the tape or adhesive does not degrade when exposed to the operating temperatures of air within the flue device. In other implementations, the flue device may be coupled to the computer rack or other structure using fasteners such as, without limitation, clips, screws, latches, or bolts. The flue device may also be attached using, without limitation, one or more of rope, belts, bands, straps, or tie downs.

Figure 10:
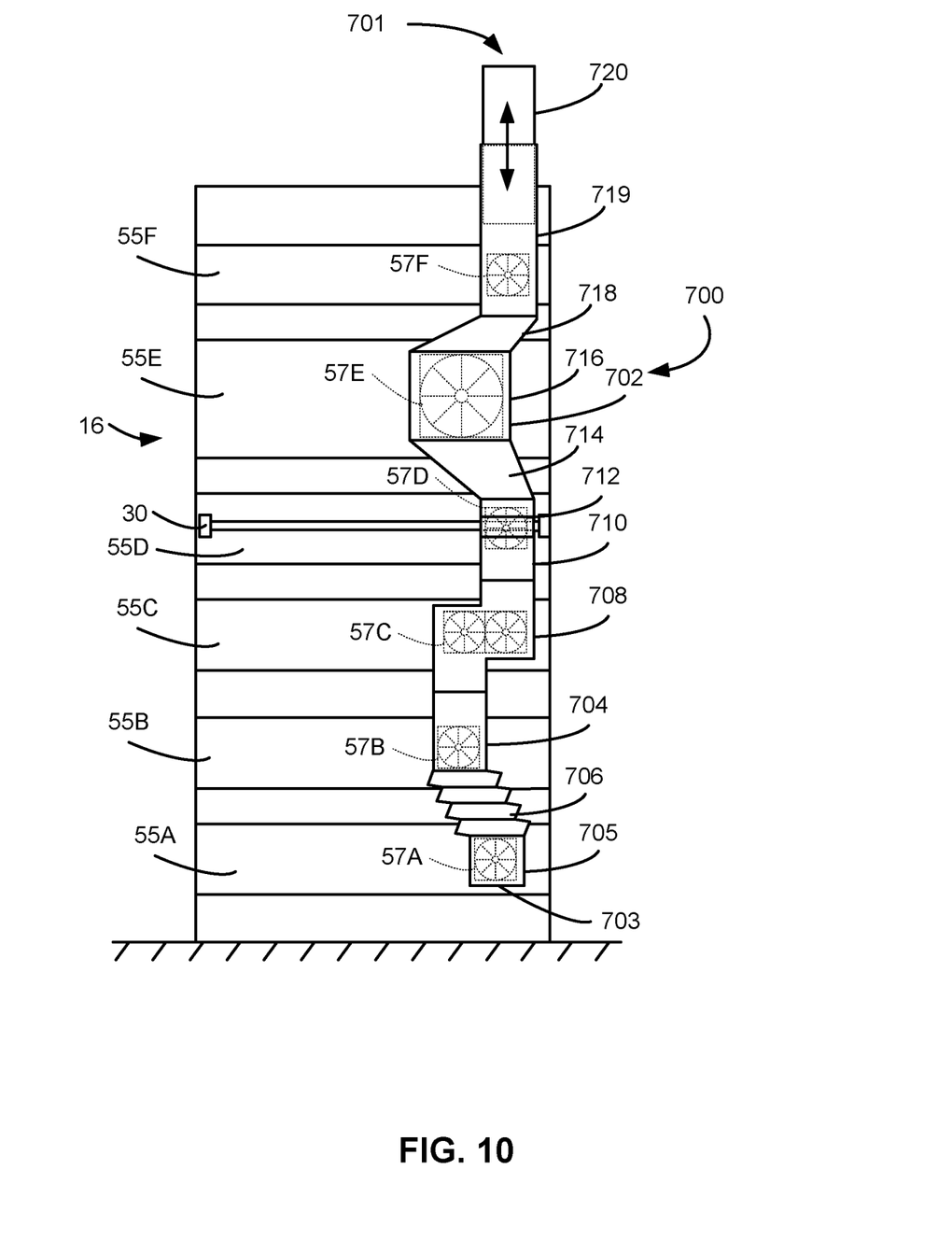
FIG. 10 is a schematic illustration of a computer rack to which a seventh implementation of a flue device is coupled.

FIG. 10 illustrates yet another flue device 700 coupled to a computer rack 16. The computer rack 16 includes various rack-mounted computing devices 55A-55F, each of which includes a respective ventilation or fan system 57A-57F.

The flue device 700 is intended to illustrate various features of flue devices in accordance with this disclosure. Implementations of this disclosure are not limited to the specific details of the flue device 700, rather, the flue device 700 is intended to illustrate various features that may be included, alone or in combination, in flue devices of this disclosure.

Generally, the flue device 700 includes various segments and components that are coupled together to define an elongate body 702. The segments and components may be designed to have varying structures and functions to accommodate variations in computer rack designs.

The flue device 700 includes a base segment 705 which may generally include a closed bottom 703 that prevents air within the elongate body 702 from dropping out of the flue device 700. The base segment 705 is generally sized to cover the fan system 57A of the rack-mounted computing device 55A.

As shown, the fan system 57B of the rack-mounted computing device 55B is covered by a similar flue segment 704 as the fan system 57A of the rack-mounted computing device 55A, however, because the fan system 57B is not aligned with the fan system 57A, the base segment 705 is coupled to the flue segment 704 by a bellows 706. The bellows 706 is generally formed of a material and/or has a construction that enables expansion, contraction, and bending to accommodate differences in alignment between fan systems of rack-mounted computing devices. In other implementations, an angled or curved flue segment may be used instead of the bellows to account for such differences in alignment.

The flue segment 704 is then coupled to a double-width segment 708 shaped to accommodate the fan system 57B of the rack-mounted computing device 55B. As shown, the double-width segment forms an s-shaped section such that it covers both fans of the fan system 57B. The double-width segment 708 is generally representative of any segment of the flue device required to accommodate a sudden increase in width of the elongate body 702. Such segments may expand to accommodate two or more fans and may include inlets and outlets that are collinear or, as is the case with the double-width segment 708, may be offset relative to each other.

The next segment 710 of the flue device 700 is shaped to accommodate both a fan system 57D of the rack-mounted computing device 55D, but also a rod 30 extending across the rack-mounted computing device 55D. The segment 710 is representative of any segment of a flue device in accordance with this disclosure that must accommodate or otherwise extend around additional structural elements of the computer rack to which it is coupled. In certain implementations, for example, the segment 710 may include an additional extension 712 through which the rod 30 or other structural element may extend. Alternatively, the segment 710 may include a groove or other depression to avoid interference with the structural element. In still other implementations, the segment 710 may be formed of a flexible material such that the segment 710 may be bent around or otherwise shaped to pass the structural element. In still other elements, the segment 710 may include cutouts, knockouts, or fibers, similar to the implementations illustrated in FIGS.

4A-6 through which the structural element may pass. In still other implementations, the segment 710 may include multiple segment portions that clip together or can otherwise be combined around structural elements.

As shown in FIG. 10, the fan system 57E of rack-mounted computing device 55E is substantially larger than the remaining fan systems 57A-57D and 57F. To accommodate the larger size of the fan system 57E, the flue device 700 may include an expanding segment 714, coupled to a large segment 716 which in turn is coupled to a contracting segment 718. Accordingly, the flue device 700 may expand via the expanding segment 714 to accommodate the larger size of the fan system 57E with the large segment 716 then subsequently reduce via the contracting segment 718 to accommodate the smaller fan system 57F of the rack-mounted computing device 55F.

In the implementation illustrated in FIG. 10, the flue device 700 terminates in a terminal segment 720 that includes the upper open end 701 of the flue device 700. The terminal segment 720 is shown as being longitudinally adjustable. For example, the terminal segment 720 may be slid or otherwise translated within the segment 719. To facilitate such translation, the segment 719 may include slots or protrusions that mate with corresponding features of the terminal segment 720. In other implementations, the terminal segment 720 may be retained within the segment 719 by a frictional fit.

Although shown as being implemented in specific locations along the flue device 700, the various features of the preceding discussion may be implemented throughout flue devices in accordance with this disclosure. For example, one or more bellows or similar features may be used along the length of a flue device to accommodate multiple changes in alignment between subsequent fan systems. Similarly, the telescoping/longitudinally translatable feature of the terminal segment 720 may be included at other locations along the elongate body 702 to enable length adjustments and more precise configurations of the flue device 700.

Figure 11:
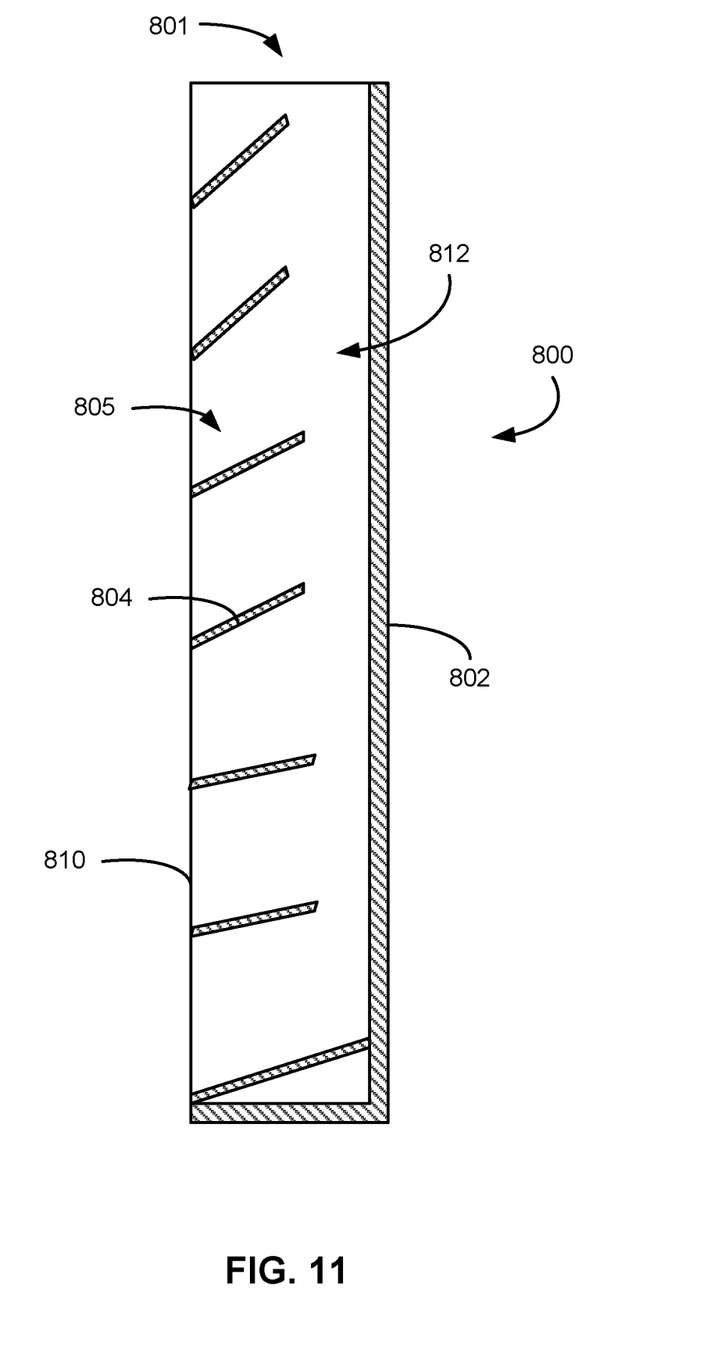
FIG. 11 is a cross-sectional side view of an eighth implementation of a flue device, the flue device including internal baffles.

FIG. 11 is a cross-sectional side view of a flue device 800 according to the present disclosure. The flue device 800 includes an elongate body 802 defining a ventilation channel 805. The elongate body 802 may further define cable or similar cutouts, however, such cutouts are omitted from FIG. 11 for clarity.

As shown in FIG. 11, a set of baffles, such as the baffle 804, are disposed within the ventilation channel 805 to direct airflow received by the flue device 800. The baffles 804 may be arranged and oriented within the ventilation channel 805 to direct air received from rack-mounted computing equipment of a computer rack to which the flue device 800 is coupled in an upward or other direction.

The baffles 804 of the flue device 800 are disposed toward an open side 810 of the flue device 800 such that an unobstructed column 812 extends along the ventilation channel 805 to the open end 801 of the elongate body 802. The baffles 804 are also oriented at progressively greater angles along the elongate body 802 such that the baffles near the open end 801 direct airflow at a more aggressive angle.

In other implementations of flue devices according to this disclosure and including baffles, the configuration of the baffles may differ from that illustrated in FIG. 11. For example, flue devices may have any suitable quantity of baffles, each of which may be positioned and oriented at any suitable angle to encourage airflow along the ventilation channel 805.

In certain implementations, the baffles 804 may be integrally formed with the elongate body 802. In other implementations, the elongate body 802 may include holes, grooves, tongues, or other features to which the baffles 804 may be coupled. The baffles 804 may also be retained within the elongate body 802 using clips or other fasteners. In implementations in which the baffles are not integrally formed with the elongate body 802, the baffles 804 may be selectively installed and removed from the flue device 800 to accommodate variations in computer rack design, including variations in the positioning of rack-mounted equipment.

Figure 12:
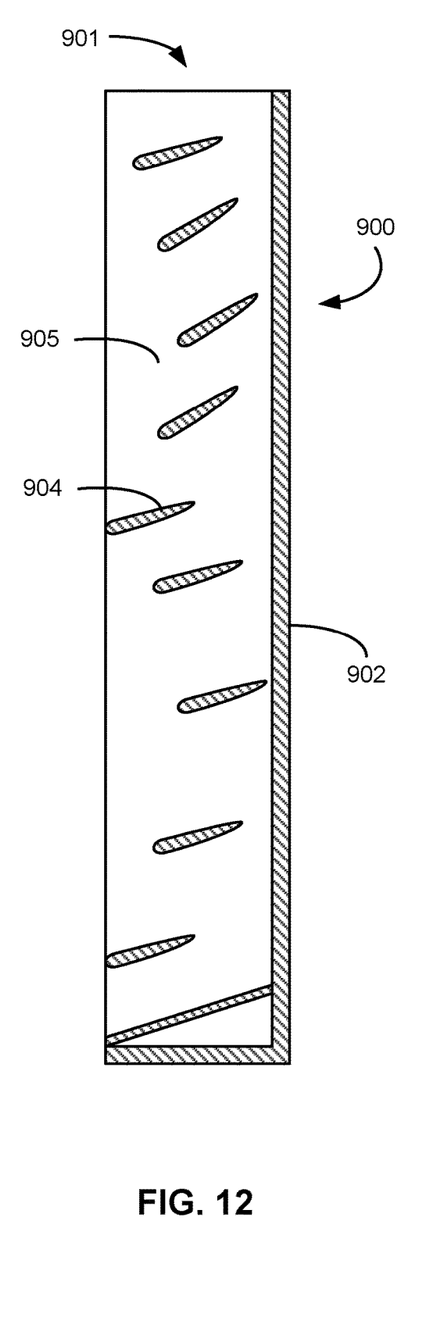
FIG. 12 is a cross-sectional side view of a ninth implementation of a flue device including internal airfoils.

FIG. 12 is a cross-sectional side view of another flue device 900 according to this disclosure. The flue device 900 includes an elongate body 902 having an open end 901 and defining a ventilation channel 905. Similar to the baffles 804 of the flue device 800 of FIG. 11, the flue device 900 further in includes airfoils, such as the airfoil 905, disposed within the elongate body 902 along the ventilation channel 905. Also similar to the baffles 804 of FIG. 11, the airfoils 905 may be positioned and oriented along the ventilation channel 905 to direct airflow. The airfoils 905 may also be removable and/or adjustable within the ventilation channel 905 to enable the flue device 900 to be used with different computer rack configurations. Each of the airfoils 905 may further be shaped and oriented within the ventilation channel 905 to encourage airflow within the ventilation channel 905 by creating eddies or areas of varying air pressure within the ventilation channel 905.

Figure 13:
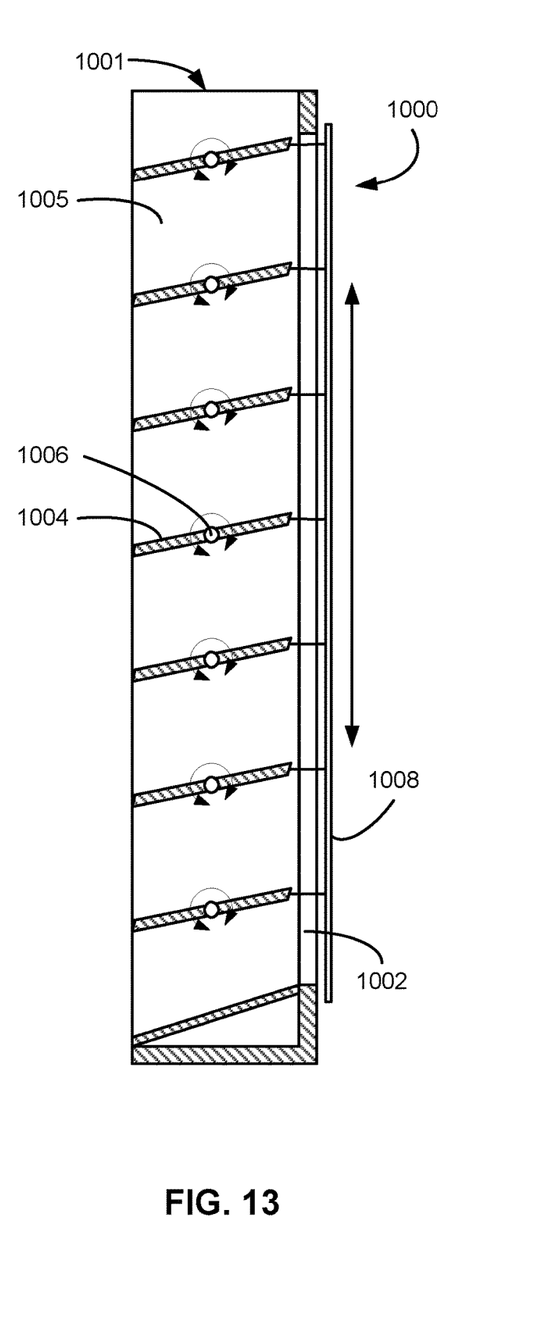
FIG. 13 is a cross-sectional side view of a tenth implementation of a flue device including a louver mechanism.

FIG. 13 is a cross-sectional side view of yet another flue device 1000 according to this disclosure. The flue device 1000 includes an elongate body 1002 having an open end 1001 and defining a ventilation channel 1005. The flue device 1000 further includes a plurality of adjustable louvers, such as the louver 1004, disposed along the ventilation channel 1005. Each of the louvers 1004 is rotatable about a pivot, such as the pivot 1006 to vary the angle of deflection provided by the louvers 1004. In certain implementations, the louvers 1004 may be coupled to a rod 1008 or similar element that may be translated vertically to cause simultaneous rotation of each of the louvers 1004.

In certain implementations, flue devices according to this disclosure may include a fan, blower, or similar forced air device. Examples of such implementations are illustrated in each of FIGS. 14A-14C.

Figure 14A:
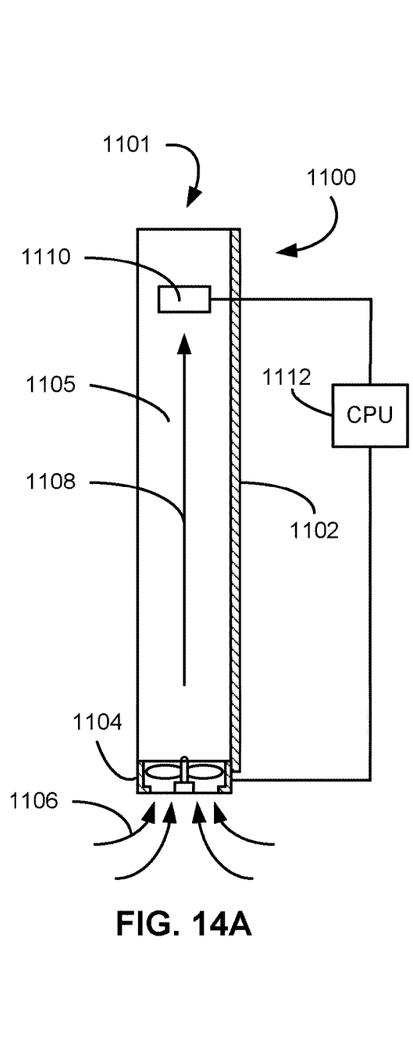
FIGS. 14A-14C are cross-sectional side views of implementations of flue devices, each of the flue devices including a fan.

FIG. 14A, for example, illustrates a flue device 1100 having an elongate body 1102 with an open end 1101 and defining a ventilation channel 1105. The flue device 1100 further includes a fan 1104 disposed opposite the open end 1101. During operation, the fan 1104 draws intake air 1106 into the ventilation channel 1105 and creates a forced air current 1108 within the elongate body 1102 to encourage airflow toward the open end 1101.

Figure 14B:
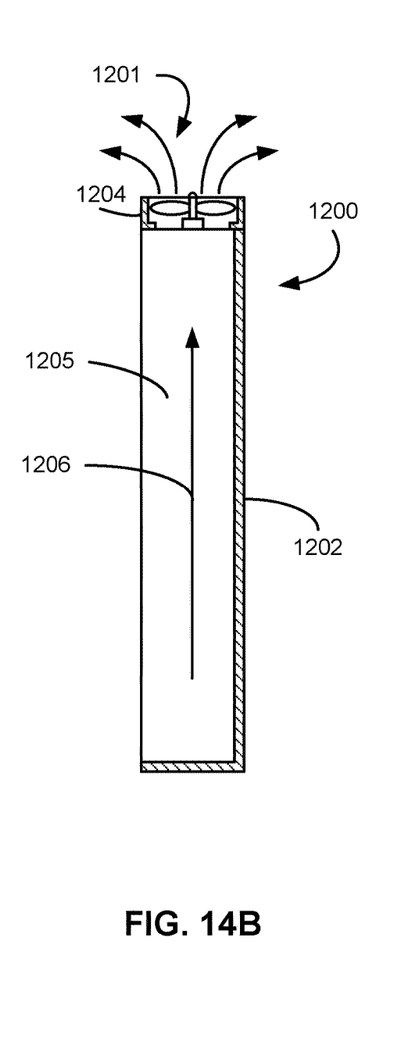

FIG. 14B illustrates another flue device 1200 having an elongate body 1202 with an open end 1201 and defining a ventilation channel 1205. The flue device 1200 further includes a fan 1204 disposed at the open end 1201. During operation, the fan 1204 pulls air from within the ventilation channel 1205, as indicated by arrow 1206, and through the open end 1201, thereby encouraging air flow through the flue device 1200.

Figure 14C:
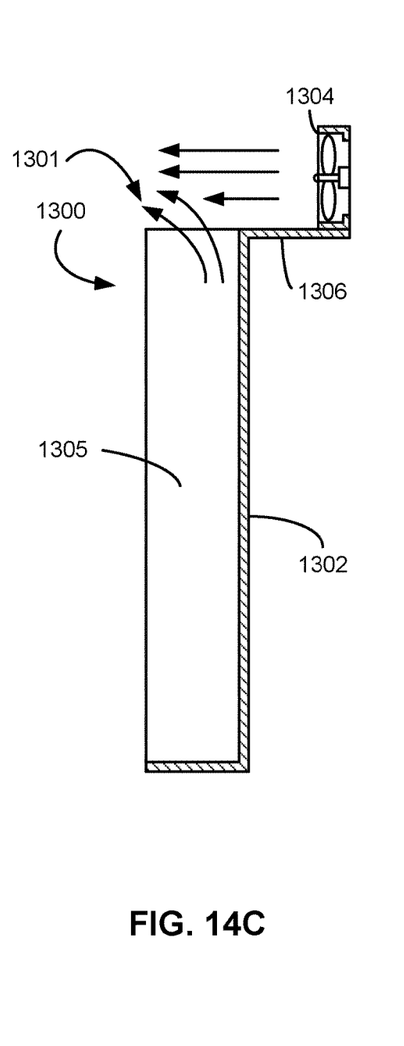

FIG. 14C illustrates yet another flue device 1300 with an elongate body 1302 having an open end 1301 and defining a ventilation channel 1305. The flue device 1300 further includes a fan 1304 disposed adjacent the open end 1301 such that forced air generated by the fan 1304 blows across the open end 1301. By doing so, the fan 1304 creates an area of low pressure adjacent the open end 1301 that encourages airflow through the flue device 1300. The fan 1304 is shown in FIG. 14C as being coupled to the flue device 1300 by a bracket 1306. In certain implementations, the fan 1304 may be positioned to force air across multiple flue devices.

Referring back to FIG. 14A, flue devices according to the present disclosure may include one or more sensors, such as sensor 1110, disposed along the ventilation channel 1105 or otherwise located to measure characteristics of the airflow within the flue device 1100. For example, the sensor 1110 may be used to measure one or more parameters including, without limitation, one or more of temperature, pressure, and flow rate within the ventilation channel 1105. The sensor 1110 may in turn be coupled to a controller 1112 or other computing device adapted to receive measurements from the sensor 1110 and to control one or more actuators for controlling operation of the flue device 1100. In certain implementations, for example, a controller 1112 may activate the fan 1104 in response to the sensor 1110 measuring airflow below a predetermined threshold or temperature above a predetermined threshold. In other implementations, the controller 1112 may be communicatively coupled to an actuator that changes the position and/or orientation of baffles, louvers, airfoils, or other structures disposed within the elongate body 1102 in response to measurements obtained from the sensor 1110.

FIGS. 15A-15D are cross-sectional views of various flue devices according to this disclosure and are intended to illustrate some shapes of possible flue devices. FIGS. 15A-15D are not intended to be limiting and flue devices having cross-sectional shapes other than those illustrated are within the scope of this disclosure.

Figure 15A:
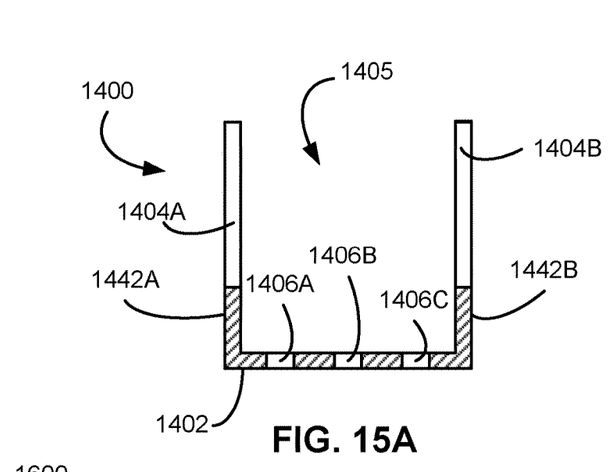
FIGS. 15A-15D are cross-sectional top views of implementations of flue devices having varying cross-sectional shapes.

FIG. 15A illustrates a flue device 1400 having a substantially square/rectangular or U-shaped profile. The flue device 1400 includes an elongate body 1402 having a rear wall 1440 and a pair of parallel side walls 1442A, 1442B extending substantially perpendicular to the rear wall 1440 such that the elongate body 1402 defines a ventilation channel 1405. The rear wall 1440 defines rear cutouts 1406A-1406C and each of the side walls 1442A, 1442B similarly define side cutouts 1404A, 1404B. The rear cutouts 1406A-1406C and the side cutouts 1404A, 1404B may be used, for example, to insert cables into or run cables through the flue device 1400.

Figure 15B:
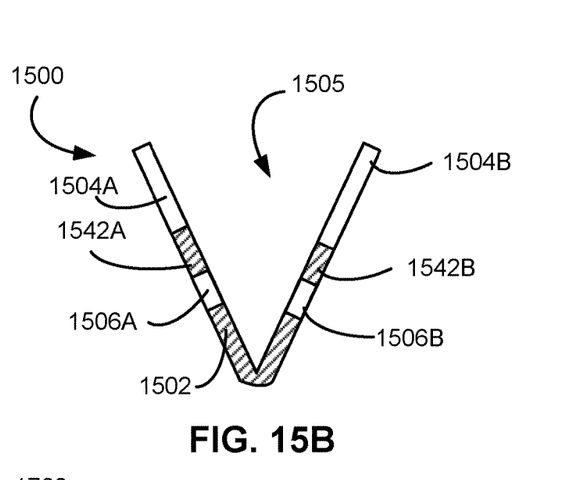

FIG. 15B illustrates a flue device 1500 having a V-shaped profile. The flue device 1500 includes an elongate body 1502 having intersecting side walls 1542A, 1542B such that the elongate body 1502 defines a ventilation channel 1505. Each of the first side wall 1542A and the second side wall 1542B further define pairs of cutouts 1504A, 1506A and 1504B, 1504B, respectively.

Figure 15C:
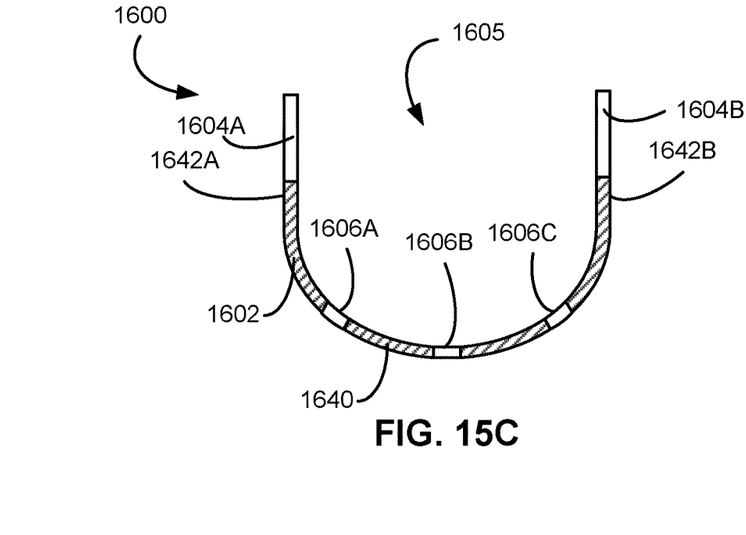

FIG. 15C illustrates a flue device 1600 having a partially curved profile. The flue device 1600 includes an elongate body 1602 having a curved rear wall 1640 and a pair of parallel side walls 1642A, 1642B extending from the curved rear wall 1640 such that the elongate body 1602 defines a ventilation channel 1605. The curved rear wall 1640 defines rear cutouts 1606A-1606C and each of the side walls 1642A, 1642B similarly define side cutouts 1604A, 1604B.

Figure 15D:
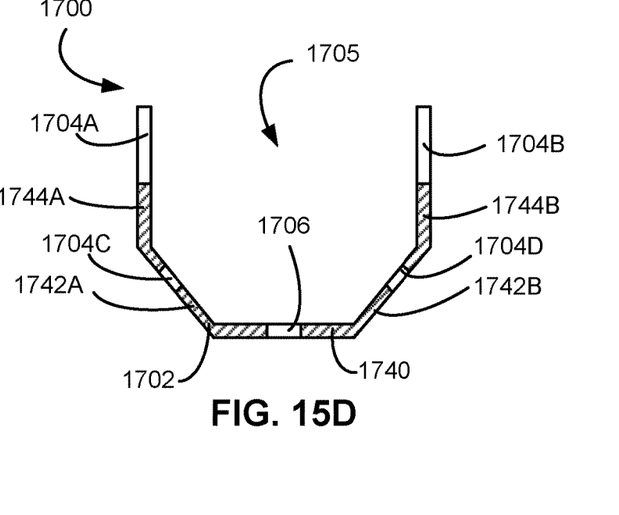

FIG. 15D illustrates a flue device 1700 having an angular profile. The flue device 1700 includes an elongate body 1702 having a rear wall 1740, a first pair of side walls 1742A, 1742B extending from the rear wall 1740 and a second pair of side walls 1744A, 1744B extending perpendicular to the rear wall 1740, thereby defining a ventilation channel 1705. The rear wall 1740 defines a rear cutout 1706, while the sidewalls 1742A, 1742B and 1744A, 1744B define a cutouts 1704A-1704D.

Although described herein as being separate and attachable to a computer rack, flue devices in accordance with the present disclosure may also be incorporated, in whole or in part, into the structure of the computer rack itself. For example, in certain implementations, the computer rack may include a frame adapted to receive one or more computing devices including respective ventilation/fan systems. A flue device or segments of a flue device may be coupled to or integrally formed with the frame of the computer rack in locations corresponding to the ventilation/fan systems of one or more of the computing devices.

It is believed that the present disclosure and many of its attendant advantages should be understood by the foregoing description, and it should be apparent that various changes may be made in the form, construction, and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it should be understood that these embodiments are illustrative and that the scope of the disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A flue device for a computer rack, the flue device comprising:
    an elongate body comprising a plurality of segments, the plurality of segments defining a ventilation channel and comprising:
        a top segment including an open end;
        a bottom segment including a closed bottom; and
        an intermediate segment disposed between the top segment and the bottom segment, the intermediate segment having a first open end, a second open end, and a peripheral wall connecting the first open end and the second open end, the peripheral wall having a first portion adjacent to and entirely surrounding the first open end and a second portion adjacent to and entirely surrounding the second open end, the second portion being horizontally offset from the first portion; and
    a plurality of coupling features disposed along the elongate body, each coupling feature of the plurality of coupling features adapted to detachably couple the elongate body to at least one of the computer rack or at least one computing device retained within the computer rack,
    wherein, when coupled, a portion of the plurality of segments aligns with a vent of a computing device on the computer rack and the elongate body extends in a substantially vertical direction with the open end extending upward to direct received exhaust air toward the open end.

2. The flue device of claim 1, wherein the plurality of coupling features includes a plurality of magnets disposed along the elongate body.

3. The flue device of claim 1, wherein the plurality of coupling features includes a plurality of hooks disposed along the elongate body, each hook of the plurality of hooks shaped to engage a corresponding structural feature of the computer rack.

4. The flue device of claim 1, wherein the elongate body defines a cable cutout disposed along the elongate body.

5. The flue device of claim 4, wherein the elongate body further comprises a plurality of fibers extending into the at least one cable cutout, the plurality of fibers configured to contact and support a cable within the cable cutout.

6. The flue device of claim 1, wherein the elongate body defines a plurality of cable cutouts, each of the cable cutouts having a knock out disposed therein, the knock out removable from the cable cutout.

7. The flue device of claim 1, wherein the intermediate segment includes an expandable bellows.

8. The flue device of claim 1, wherein the intermediate segment is one of an angled segment, a curved segment, and an s-shaped segment.

9. The flue device of claim 1, wherein a first portion of the top segment is longitudinally translatable relative to a second portion of the top segment.

10. The flue device of claim 1, further comprising at least one baffle disposed within the ventilation channel, the at least one baffle oriented to direct the received exhaust air toward the open end.

11. The flue device of claim 1, further comprising at least one airfoil disposed within the ventilation channel, the at least one airfoil oriented to direct the received exhaust air toward the open end.

12. The flue device of claim 1, further comprising at least one movable louver disposed within the ventilation channel.

13. The flue device of claim 1, further comprising a fan coupled to the elongate body and aligned with the ventilation channel to force the received exhaust air through the ventilation channel.

14. The flue device of claim 13, wherein the fan is one of disposed at the open end and configured to draw the received exhaust air through the ventilation channel and disposed opposite the open end and configured to push the received exhaust air through the ventilation channel.

15. The flue device of claim 1 further comprising a sensor configured to measure one or more characteristics of the received exhaust air within the ventilation channel, wherein the one or more characteristics of the received exhaust air within the ventilation channel include one or more of a temperature of the received exhaust air, a pressure of the received exhaust air, and a flow rate of the received exhaust air10.

16. The flue device of claim 15 further comprising a controller communicatively coupled to the sensor, the controller adapted to receive one or more measurements from the sensor and to actuate one or more actuators in response to the one or more measurements received from the sensor.

17. A computer rack comprising:
a frame;
one or more computing devices mounted within the frame, the one or more computing devices comprising a vent; and
a flue device supported, at least in part, by at least one of the frame or a computing device of the one or more computing devices, the flue device comprising:
an elongate body comprising a plurality of segments, the plurality of segments defining a ventilation channel and comprising:
a top segment including an open end;
a bottom segment including a closed bottom; and
an intermediate segment disposed between the top segment and the bottom segment, the intermediate segment having a first open end, a second open end, and a peripheral wall connecting the first open end and the second open end, the peripheral wall having a first portion adjacent to and entirely surrounding the first open end and a second portion adjacent to and entirely surrounding the second open end, the second portion being horizontally offset from the first portion; and
a plurality of coupling features disposed along the elongate body, each coupling feature of the plurality of coupling features adapted to couple the elongate body to the at least one of the frame or the computing device of the one or more computing devices,
wherein a portion of the plurality of segments aligns with the vent and the elongate body extends in a substantially vertical direction with the open end extending upward to direct received exhaust air toward the open end.

18. The computer rack of claim 17, wherein the flue device is detachable from the at least one of the frame or the computing device of the one or more computing devices.

19. A flue device for a computer rack, the flue device comprising:
an elongate body comprising a plurality of segments, the plurality of segments defining a ventilation channel and comprising:
a top segment including an open end;
a bottom segment including a closed bottom; and
an intermediate segment disposed between the top segment and the bottom segment, the intermediate segment including a first open end having a first width and a second open end having a second width, the second width being different than the first width; and
a plurality of coupling features disposed along the elongate body, each coupling feature of the plurality of coupling features adapted to detachably couple the elongate body to at least one of the computer rack or at least one computing device retained within the computer rack,
wherein, when coupled, the elongate body extends in a substantially vertical direction with the open end extending upward to direct received exhaust air toward the open end.

20. The flue device of claim 19, wherein the plurality of segments further comprises a second intermediate segment having a third open end and a fourth open end horizontally offset from the third open end.

* * * * *